(12) United States Patent
Chan

(10) Patent No.: US 9,330,900 B2
(45) Date of Patent: May 3, 2016

(54) LAYER-BY-LAYER DEPOSITION OF CARBON-DOPED OXIDE FILMS THROUGH CYCLICAL SILYLATION

(71) Applicant: Applied Materials, Inc., Santa Clara, CA (US)

(72) Inventor: Kelvin Chan, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/653,119

(22) PCT Filed: Feb. 18, 2014

(86) PCT No.: PCT/US2014/016944
§ 371 (c)(1),
(2) Date: Jun. 17, 2015

(87) PCT Pub. No.: WO2014/158462
PCT Pub. Date: Oct. 2, 2014

(65) Prior Publication Data
US 2015/0371846 A1    Dec. 24, 2015

Related U.S. Application Data

(60) Provisional application No. 61/784,013, filed on Mar. 14, 2013.

(51) Int. Cl.
| | |
|---|---|
| *H01L 21/44* | (2006.01) |
| *H01L 21/02* | (2006.01) |
| *H01L 21/768* | (2006.01) |
| *H01L 21/285* | (2006.01) |
| *H01L 23/532* | (2006.01) |
| *H01L 21/3105* | (2006.01) |

(52) U.S. Cl.
CPC ...... *H01L 21/02126* (2013.01); *H01L 21/0228* (2013.01); *H01L 21/02211* (2013.01); *H01L 21/02315* (2013.01); *H01L 21/2855* (2013.01); *H01L 21/28556* (2013.01); *H01L 21/76831* (2013.01); *H01L 21/76843* (2013.01); *H01L 23/5329* (2013.01); *H01L 23/53238* (2013.01); *H01L 21/31058* (2013.01)

(58) Field of Classification Search
None
See application file for complete search history.

(56) References Cited

U.S. PATENT DOCUMENTS

| | | | |
|---|---|---|---|
| 6,028,015 A | 2/2000 | Wang et al. | |
| 2007/0161256 A1 | 7/2007 | Gates et al. | |
| 2012/0270339 A1* | 10/2012 | Xieh011 | H01L 21/3105 438/4 |
| 2012/0329287 A1 | 12/2012 | Gates et al. | |

FOREIGN PATENT DOCUMENTS

| | | |
|---|---|---|
| JP | 2007194639 A | 8/2007 |
| KR | 10-2011-0125651 | 11/2011 |

OTHER PUBLICATIONS

International Search Report and Written Opinion dated Jun. 25, 2015 for Application No. PCT/US2014/16944.

\* cited by examiner

*Primary Examiner* — Angel Roman
(74) *Attorney, Agent, or Firm* — Patterson & Sheridan, LLP

(57) ABSTRACT

Embodiments of the present invention generally relate to methods of forming carbon-doped oxide films. The methods generally include generating hydroxyl groups on a surface of the substrate using a plasma, and then performing silylation on the surface of the substrate. The hydroxyl groups on the surface of the substrate are then regenerated using a plasma in order to perform an additional silylation. Multiple plasma treatments and silylations may be performed to deposit a layer having a desired thickness.

15 Claims, 8 Drawing Sheets

LAYER-BY-LAYER DEPOSITION OF CARBON-DOPED OXIDE FILMS THROUGH CYCLICAL SILYLATION

BACKGROUND OF THE INVENTION

1. Field of the Invention

Embodiments of the invention generally relate to semiconductor manufacturing, and, more specifically, to methods of forming carbon-doped silicon oxide films.

2. Description of the Related Art

As device dimensions shrink, there is an increasing need to deposit ultra-thin films with precise thickness control. For a process to be used in manufacturing, it has to show repeatability and reproducibility. A process tool has to be able to repeatedly deposit the same thickness on many wafers, and the process has to be reproducible on a separate but identically-configured tool. Thickness uniformity control becomes even more difficult for layers having relatively small thicknesses, e.g., less than 100 angstroms, and on relatively large substrates, such as 450 millimeter diameter wafers.

Therefore, there is a need for depositing thin layers of material with precise thicknesses.

SUMMARY OF THE INVENTION

Embodiments of the present invention generally relate to methods of forming carbon-doped oxide films. The methods generally include generating hydroxyl groups on a surface of the substrate using a plasma, and then performing silylation on the surface of the substrate. The hydroxyl groups on the surface of the substrate are then regenerated using a plasma in order to perform an additional silylation. Multiple plasma treatments and silylations may be performed to deposit a layer having a desired thickness.

In one embodiment, a method of depositing a carbon-doped silicon oxide film comprises exposing a substrate to a first plasma treatment, exposing the substrate to a water-containing gas to form hydroxyl groups on a surface of the substrate, debonding water molecules from the surface of the substrate, performing silylation on the surface of the substrate, and regenerating the surface for additional silylation. The regeneration comprises exposing the substrate to a second plasma treatment, and exposing a substrate to the water-containing gas to form hydroxyl groups on the surface of the substrate.

In another embodiment, a method of forming a device on a substrate comprises depositing a carbon-doped silicon oxide layer on a low k material. The carbon doped silicon oxide layer is deposited by cyclically performing the operations of: (a) exposing the substrate to a plasma treatment; (b) exposing the substrate to the water-containing gas to form hydroxyl groups; and (c) performing a silylation reaction with the hydroxyl groups.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to methods of forming carbon-doped oxide films. The methods generally include generating hydroxyl groups on a surface of the substrate using a plasma, and then performing silylation on the surface of the substrate. The hydroxyl groups on the surface of the substrate are then regenerated using a plasma in order to perform an additional silylation. Multiple plasma treatments and silylations may be performed to deposit a layer having a desired thickness.

Figure 1:
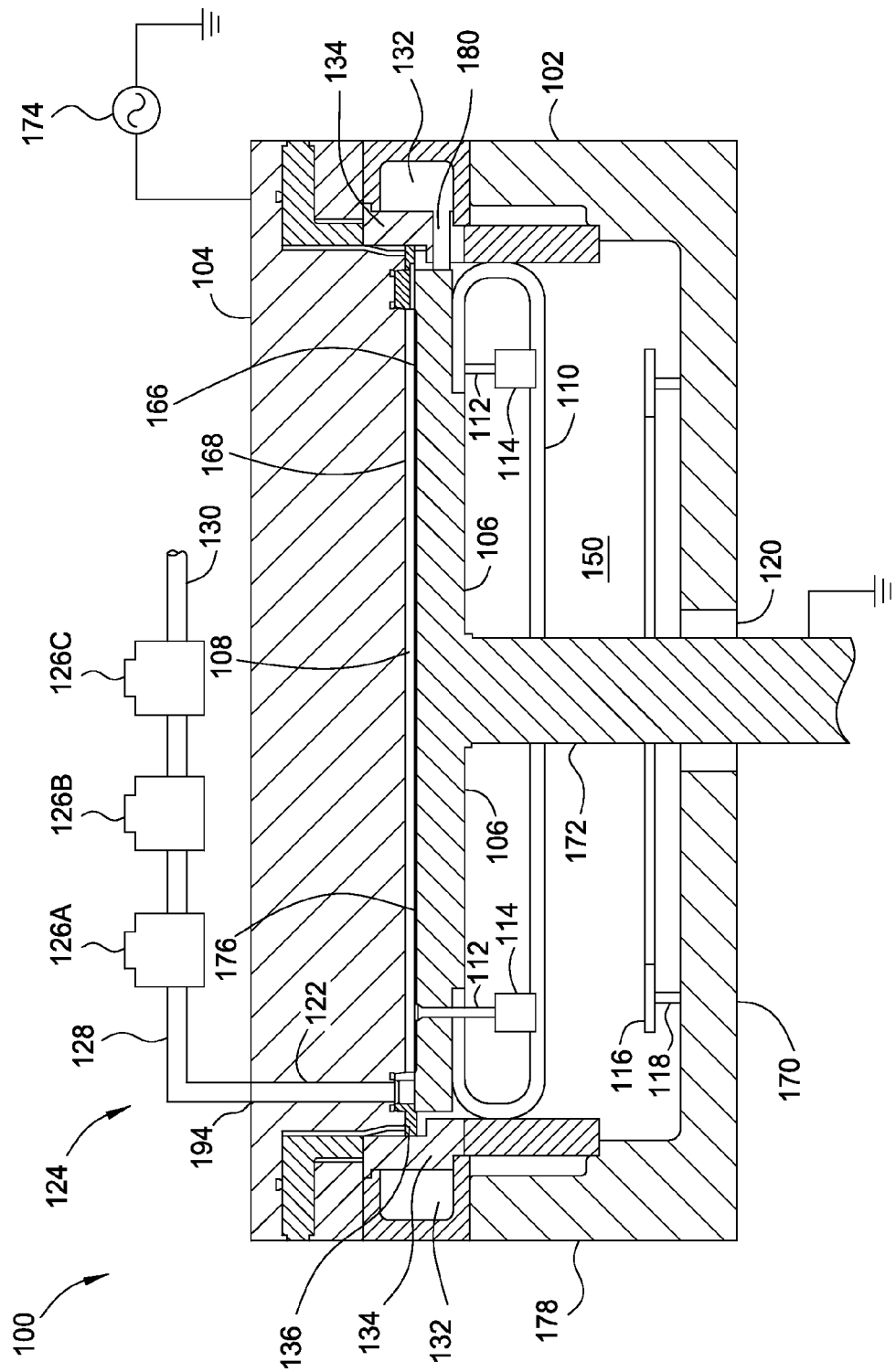
FIG. 1 is a cross-sectional view of a processing chamber adapted to practice embodiments of the invention.

FIG. 1 is a cross-sectional view of a processing chamber 100 according to one embodiment. The processing chamber 100 has a chamber body 102 and a chamber lid 104 that couples to the chamber body 102 to define an interior 150. A substrate support 106 is disposed in the interior 150 of the chamber 100. An upper surface 166 of the substrate support 106 and a lower surface 168 of the chamber lid 104 define a processing region 108 in which a substrate disposed in a substrate contact area 176 on the upper surface 166 of the substrate support 106 is exposed to a processing environment.

Substrates enter and exit the processing chamber 100 through a substrate passage or opening 110 in the chamber body 102. In the cross-sectional view of FIG. 1, the substrate passage or opening 110 is behind the cross-section plane, in the "back" of the chamber 100. The substrate support 106 is movable along a longitudinal axis of the chamber 100 to position the substrate support 106 alternately in a substrate handling position, with the upper surface 166 of the substrate support 106 proximate the opening 110, and a substrate processing position, with the upper surface 166 of the substrate support 106 proximate the lower surface 168 of the chamber lid 104. In the view of FIG. 1, the substrate support 106 is shown in the substrate processing position. When the substrate support 106 is located in the substrate processing position, a distance between the upper surface 166 of the substrate support 106 and the lower surface 168 of the chamber lid 104 is about 2 mm to about 8 mm. A shaft 172 of the substrate support 106 typically extends through an opening 120 in a lower wall 170 of the chamber body 102 and couples to a lift mechanism (not shown) to actuate movement of the substrate support 106.

A substrate elevator 112 is disposed through the substrate support 106. The substrate elevator 112 has a base 114 that contacts an actuator 116 disposed in a lower area of the interior 150 of the chamber 100. The actuator 116 is supported from the lower wall 170 by a support member 118. The actuator 116 may be an annular member, such as a ring, and the support member 118 may be an annular protrusion from the actuator 116. The actuator 116, the support member 118, or both may alternately be segmented. For example, either or both may be a segmented annular member, or the actuator 116 may be a pad, post, or spindle positioned to engage the base 114 of the substrate elevator 112.

The support member 118 maintains the actuator 116 in a substantially parallel relation to the upper surface 166 of the substrate support 106. When the substrate support 106 is moved from the processing position to the substrate handling position, the base 114 of the substrate elevator 112 contacts the actuator 116, causing the substrate elevator 112 to protrude through the upper surface of the substrate support 106 and lift a substrate disposed thereon above the upper surface for access by a substrate handling robot (not shown) through the opening 110. Only two substrate elevators 112 are visible in the view of FIG. 1, but a typical embodiment will have three or more substrate elevators 112 distributed to provide stable stationing for substrate handling.

The chamber lid 104 may be an electrode, and may be coupled to a source of RF power 174. If the chamber lid 104 is an electrode, the chamber lid 104 will typically include a conductive material. The chamber lid 104 may be entirely or substantially made of a conductive material, or may be coated with a conductive material to any convenient degree. If the chamber lid 104 is used as an electrode, the lower surface 168 of the chamber lid 104 will be conductive to provide RF coupling into the processing region 108 proximate the upper surface 166 of the substrate support 106. In one embodiment, the chamber lid 104 is aluminum. The processing chamber 100 is adapted to generate a plasma therein, such as a capacitively coupled plasma.

A gas manifold 124 is coupled to the chamber lid 104 at a port 194. Process gases are delivered to the chamber through a gas line 128. A plurality of high speed valves 126A-C control flow of gases through the gas line 128 into the chamber 100. The high speed valves may be ALD valves, and in some embodiments may be capable of opening or closing in less than 1 second, and in some cases less than 0.25 seconds. A precursor line 130 is coupled to one of the high speed valves 126A-C. The other high speed valves may be used to join other precursor lines, not visible in FIG. 1, to deliver gases through the gas line 128. Operation of the high speed valves enables fast switch of gas flows as needed for chamber operations, such as ALD deposition cycles.

The chamber lid 104 has a gas inlet 122 located in a peripheral region of the chamber lid 104 and in fluid communication with the port 194 and the gas manifold 124. The gas inlet 122 may be located outside the substrate contact area 176 of the substrate support 106. An edge ring 136 is disposed around a peripheral region of the substrate support 106. The edge ring 136 may be an annular member having an inner dimension and an outer dimension. The inner dimension of the edge ring 136 may be substantially the same as a dimension of the substrate contact area 176 such that a substrate disposed on the substrate support nests inside the edge ring 136, as shown in FIG. 1. The inner dimension of the edge ring 136 may also be larger than the dimension of the substrate contact area 176. The inner dimension of the edge ring 136 may also be smaller than the substrate contact area 176 so that a portion of the edge ring 136 extends over an edge of the substrate. The edge ring 136 of FIG. 1 rests on the substrate support 106 when the substrate support 106 is in the processing position. Thus, the substrate support 106 also supports the edge ring 136 when in the processing position.

A pumping plenum 132 is located in a side wall 178 of the chamber body 102 proximate the processing position of the substrate support 106. The pumping plenum 132 is an annular passage around the processing region 108 where processing gases are evacuated from the processing region 108. A liner 134 separates the pumping plenum 132 from the processing region 108. The liner 134 has an opening 180 that allows process gases to flow from the processing region 108 into the pumping plenum 132. The opening 180 is typically located below the upper surface 166 of the substrate support 106 when the substrate support 106 is in the processing position.

Figure 2:
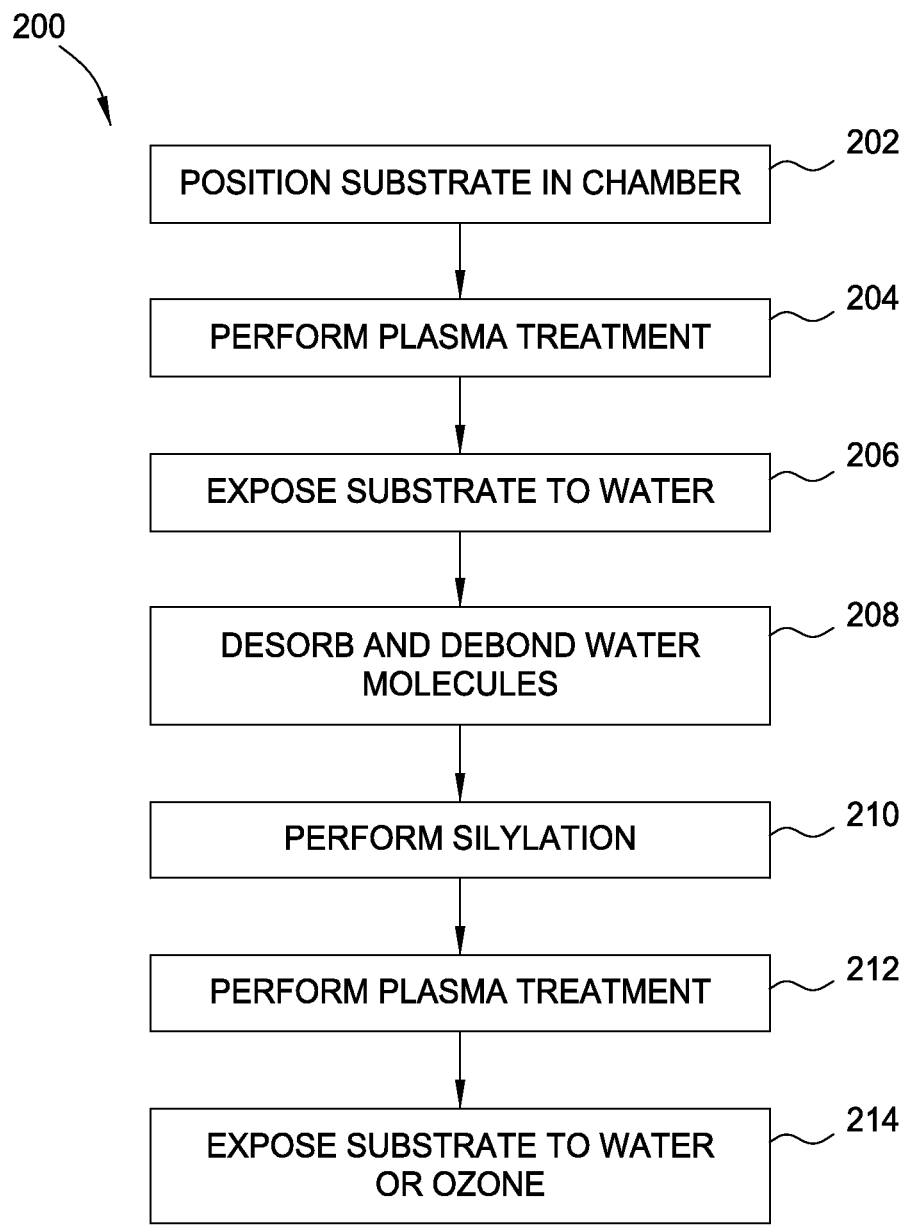
FIG. 2 is a flow diagram of method operations for depositing a carbon-doped silicon oxide film, according to one embodiment of the invention.

FIG. 2 is a flow diagram 200 of method operations for depositing a carbon-doped oxide film, according to one embodiment of the invention. FIGS. 3A-3F illustrate a substrate during formation of a carbon-doped oxide film, according to one embodiment of the invention. To facilitate explanation of embodiments of the invention, FIG. 2 and FIGS. 3A-3F will be explained in conjunction.

Figure 3A:
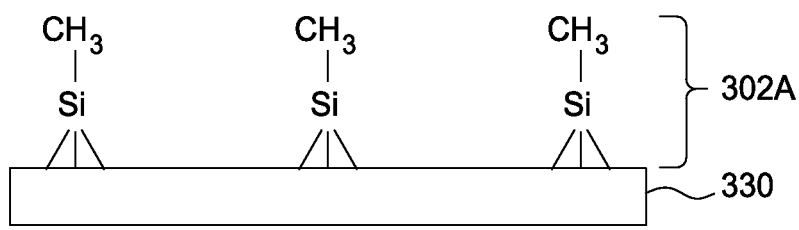
FIGS. 3A-3F illustrate a substrate during formation of a carbon-doped silicon oxide film, according to one embodiment of the invention.

Flow diagram 200 begins at operation 202. In operation 202, a substrate 330, shown in FIG. 3A, is positioned in a processing chamber, such as processing chamber 100 shown in FIG. 1. The substrate may be, for example, a silicon wafer having a silicon oxide layer or carbon-doped silicon oxide layer thereon. The substrate 330, as illustrated, includes a surface layer 302A of carbon-doped silicon oxide.

Figure 3B:
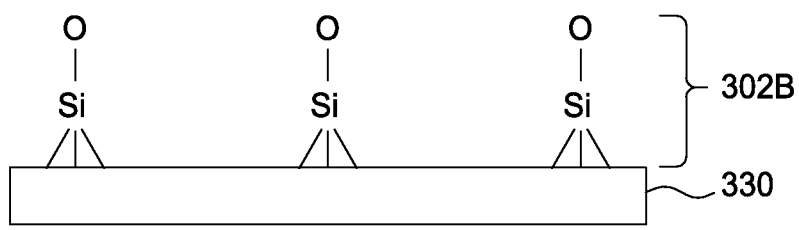

In operation 204, a plasma treatment is performed on the substrate 330. The plasma treatment includes exposing the substrate 330 to a plasma formed from oxygen, ammonia, or carbon dioxide. The plasma treatment facilitates the formation of hydroxyl groups (as described with respect to operation 206) by breaking some of the silicon-methyl bonds, and in some embodiments, adding oxygen to the surface layer 302A to form surface layer 302B, as shown in FIG. 3B. Whether or not oxygen is further introduced to the surface layer 302A depends upon whether an oxygen-containing plasma is utilized in operation 204. Additionally, the extent of incorporation of oxygen is dependent upon RF power levels utilized to generate the plasma, as well as the gas flow rate and concentration used to generate the plasma, and the exposure time of the plasma.

In one example, an oxygen-containing plasma may be generated by providing 750 sccm of oxygen and 2500 sccm of argon to a chamber, and applying 50 watts RF power to generate a plasma. The substrate may be maintained at a temperature of about 200 degrees Celsius, and the chamber pressure may be about 3 Torr. In another example, RF power may be between about 10 Watts and about 1000 Watts, such as 60 Watts. $NH_3$ gas may be provided to the chamber at a flow rate between about 100 sccm and about 5000 sccm, such as about 150 sccm. An inert gas, such as $N_2$, may be provided to the chamber at a flow rate of about 100-30000 sccm, such as 27000 sccm. The substrate may be maintained at a temperature of about 25-400 degrees Celsius, such as about 200 degrees. The pressure may be maintained within a range of about 1-10 Torr, such as 4.2 Torr. The exposure time may be within a range of about 1 second to about 60 seconds, such as 4-10 seconds.

In operation, 206, the substrate 330 is exposed to a water-containing gas to facilitate formation of hydroxyl groups on a surface of the substrate 330, thus forming surface layer 302C. The water-containing gas may include steam or water vapor produced using a water vapor generator (WVG). In one example, the flow rate of the water vapor gas may be about 1 sccm to about 1000 sccm, such as about 10 sccm.

In operation 208, undesirable water molecules present on the surface of the substrate 330 are desorbed and debonded by reducing the pressure within the processing chamber and/or by increasing the temperature within the process chamber. The volatile components may then be exhausted from the processing chamber. The substrate 330 shown in FIG. 3C does not include any bonded or absorbed water molecules thereon, as such molecules may not always be present. Thus, in some embodiments, operation 208 may be optional.

In operation 210, a silylation reaction is performed by exposing the substrate 330 to a silylating agent, such as (dimethylamino)trimethylsilane (DMATMS). The silylation results in the substitution of a hydrogen from the hydroxyl group with a trimethylsilyl pendant group, as illustrated by the surface layer 302D in FIG. 3D. The silylation reaction adds a monolayer of trimethylsilyl groups to the upper surface of the substrate 330. The reaction results in the formation of a silicon oxide layer having some carbon incorporated therein due to the presence of the methyl groups of the trimethylsilane, and thus, a carbon-doped silicon oxide layer is formed. Using the silylation reaction described above, discrete monolayers of carbon-doped silicon oxide can be formed, allowing for the reproducible deposition of relatively thin layers on a substrate.

In one example, during operation 210, the substrate is maintained at a temperature within a range of about 25 degrees Celsius to about 400 degrees Celsius, such as about 75 degrees Celsius. The pressure is maintained within a range of about 100 m Torr to about 760 Torr, such as 6 Torr. The silylating agent is carried by an inert gas provided at a flow rate of about 0.1 to about 4.0 standard liters/min (slm), such as about 2 slm. The inert gas may be one or more of helium, argon, or diatomic nitrogen. The silylating agent is provided at a rate of about 0.1 gram/min to about 4.0 gram/min. The substrate may be exposed to the silylating agent for about 5 to about 300 seconds, such as about 60 seconds.

It is to be noted that silylation reaction consumes the hydroxyl groups present in the surface layer 302C, and thus, eventually, further silylation does not occur. To facilitate further silylation, thus increasing the thickness of the film formed on the substrate 330, the surface layer 302D should be treated to induce the formation of additional hydroxyl groups thereon (e.g. regenerated). In operation 212, the substrate 330 is subjected to a plasma treatment similar to operation 204. The plasma treatment facilitates removal of one or more methyl groups from the surface layer 302D, thus resulting in surface layer 302E. The number of methyl groups removed is dependent upon the RF power levels utilized to generate the plasma, as well as the gas flow rate and concentration used to generate the plasma, and the exposure time of the plasma. Generally, the formation of more hydroxyl groups allows for more silylation reactions to occur. Thus, the rate of formation and the thickness of the formed layer can be controlled by controlling hydroxyl group formation, which is dependent upon the plasma treatment of operation 212.

Figure 3C:
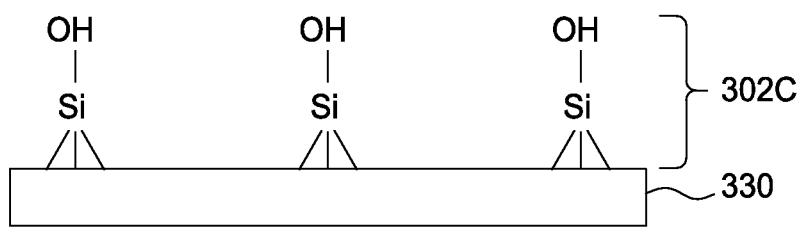
Figure 3D:
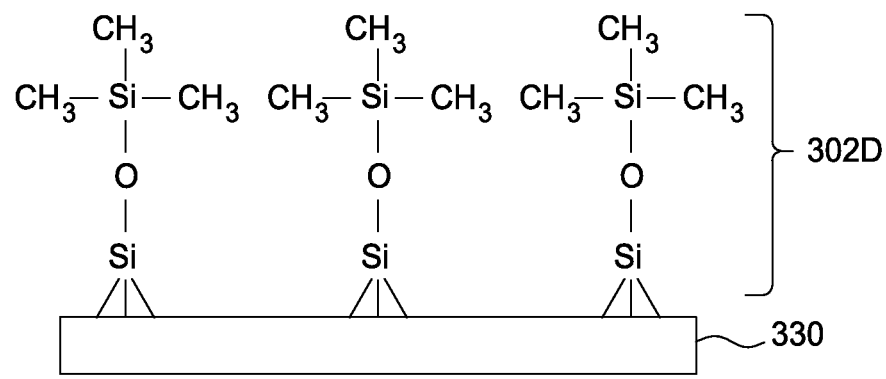
Figure 3E:
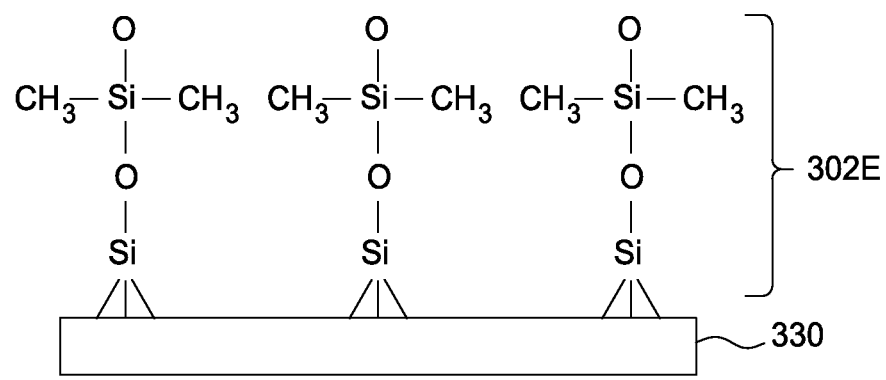
Figure 3F:
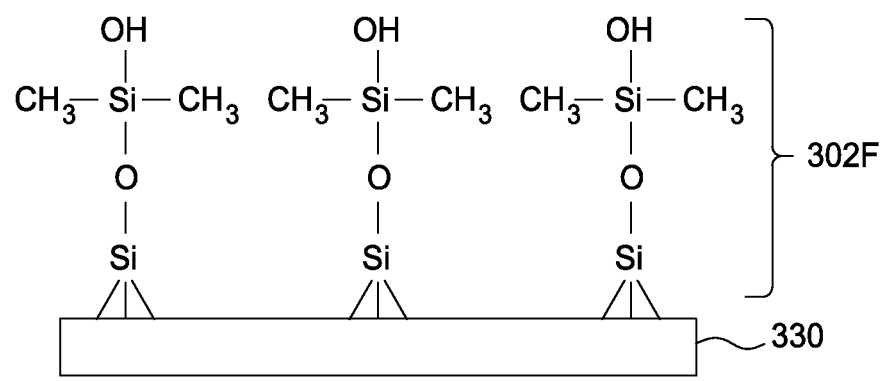

After the plasma treatment in operation 212, the substrate 330 is exposed to water in operation 214, similar to operation 206. Exposure to water in operation 214 results in the formation of hydroxyl groups on the surface layer 302F, as shown in FIG. 3F. The resultant hydroxyl groups within the surface layer 302F facilitate additional silylation on the surface of the substrate 330. Operations, 208, 210, 212, and 214 may be repeated until a carbon-doped silicon oxide layer of a desired thickness is formed on the substrate 330, for example, about 10 to about 100 cycles. Because the silylation deposits a monolayer per cycle, relatively thin layers of material can be deposited to reproducible and exact thicknesses. After a carbon-doped silicon layer has been deposited to a subsequent thickness, the process is halted, with the silylation operation (e.g., operation 210) generally being the terminating operation.

FIG. 2 and FIGS. 3A-3F illustrate one embodiment; however, other embodiments are also contemplated. In another embodiment, it is contemplated that operation 206 may be omitted. In such an example, it is contemplated that hydroxyl groups may be formed on the substrate 330 by exposing the substrate 330 to a plasma containing hydrogen, such as ammonia, during operation 204. In another embodiment, it is contemplated that the substrate 330 may be exposed to ozone gas during operations 204 and/or 212 rather than a plasma. In such an embodiment, exposure of the substrate 330 to ozone gas facilitates breaking of silicon-oxygen bonds and/or incorporation of additional oxygen to the surface of the substrate 330. In another embodiment, operations 204, 206, 208, 210, 212, and 214 may occur with ultraviolet (UV) radiation impinging upon the substrate to facilitate the respective operation.

In another embodiment, it is contemplated that the carbon concentration within the deposited carbon-doped silicon oxide film can be adjusted based on the silylation precursor utilized in operation 210. For example, utilization of a substituted silyl group containing more carbon during the silylation results in additional carbon being incorporated into the deposited carbon-doped silicon oxide layer. In one example, the silyl group may be substituted with methyl, ethyl, propyl, or higher carbon alkyl groups. In another embodiment, it is contemplated that operations 204, 206, 208, and 210, 212, and 214 may occur in the same process chamber, or in different process chambers. In another embodiment, the carbon doped silicon layer may have a porosity of about 10 percent or less.

In another embodiment, it is contemplated that operations 204 and 206, and/or 212 and 214, may be replaced with a first treatment with an oxidizing chemistry (e.g., $O_2$ or $CO_2$ plasma) and then treated with a reducing chemistry (e.g., $NH_3$ plasma). Such an embodiment provides at least two potential benefits: (1) it may not be necessary to utilize water to form hydroxyl groups on the substrate surface, and (2) the copper surface (e.g., the via bottom) may be kept substantially free of oxides by performing the reducing chemistry after the oxidizing chemistry. Alternatively, FIGS. 4A-4F illustrate a substrate during formation of a carbon-doped silicon oxide film, according to another embodiment of the invention. FIGS. 4A-4F are similar to FIGS. 3A-3F, however, the silylation in FIG. 4D utilizes a different silylating agent than is shown in FIG. 3D. It should also be noted that FIGS. 4A-4F also correspond to flow diagram 200, similar to FIGS. 3A-3F.

Figure 4A:
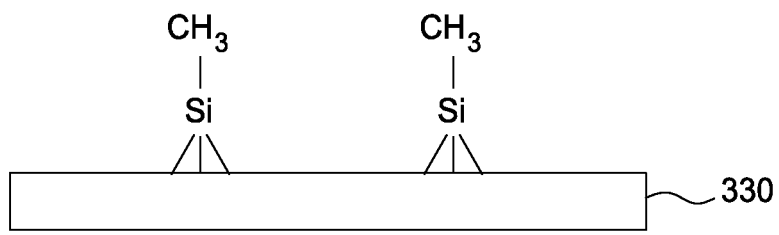
FIGS. 4A-4F illustrate a substrate during formation of a carbon-doped silicon oxide film, according to another embodiment of the invention.
Figure 4B:
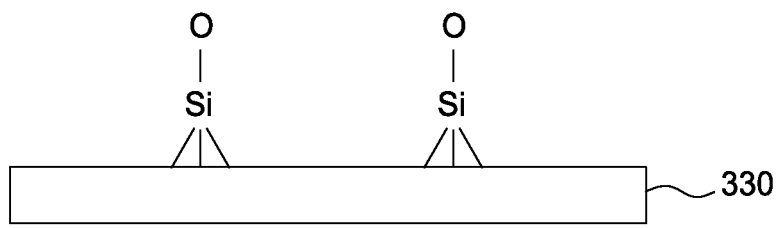
Figure 4C:
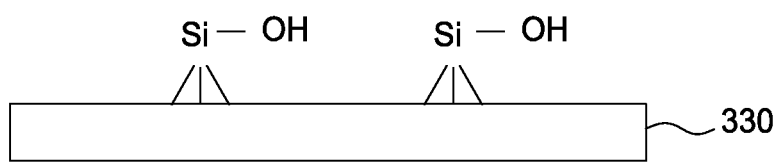
Figure 4D:
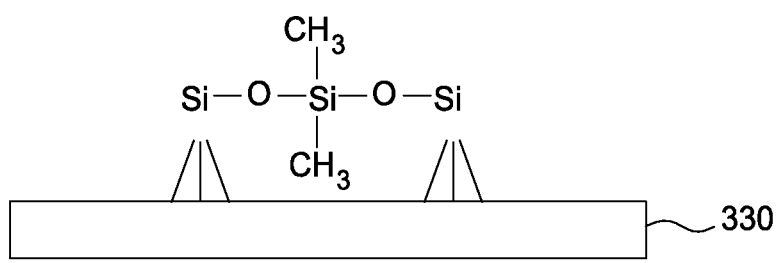
Figure 4E:
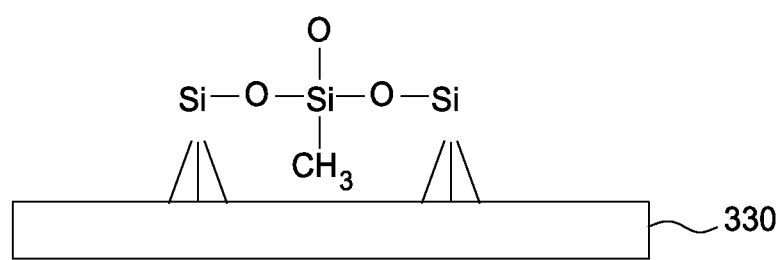
Figure 4F:
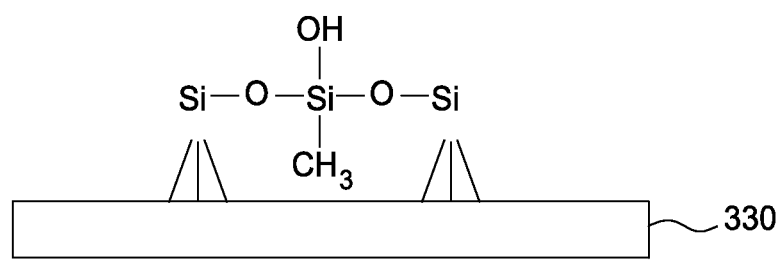

FIG. 4A illustrates a starting substrate 330, which may be positioned in a chamber, as similarly described with respect operation 202. FIG. 4B illustrates the substrate 330 after plasma treatment, as similarly described with respect to operation 204. FIG. 4C illustrates the substrate 330 after exposure to water, as similarly described with respect operation 206. FIG. 4D illustrates the substrate during silylation. During the silylation shown FIG. 4D, a bifunctional silylating agent, such as bis(dimethylamino)dimethylsilane (BDMADMS), is utilized. The utilization of bifunctional silylating agents enhances cross-linking of the deposited film. In FIG. 4E, a second plasma treatment occurs, as similarly described with respect operation 212. In FIG. 4F, the substrate 330 is exposed to water, as similarly described with respect operation 214.

Figure 5:
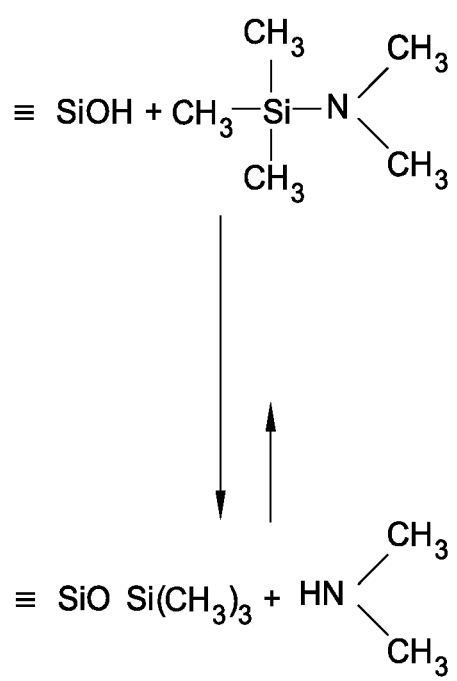
FIG. 5 illustrates an example of a silylation reaction using DMATMS as a silylating agent.

FIG. 4 illustrates one embodiment of depositing a carbon-doped silicon oxide film; however, other embodiments are also contemplated. In another embodiment, it is contemplated that bifunctional silylating agents may be used together with or in a specific sequence with mono-functional silylating agents (e.g., DMATMS). FIG. 5 illustrates an example of a silylation reaction using DMATMS as a silylating agent.

Figure 6:
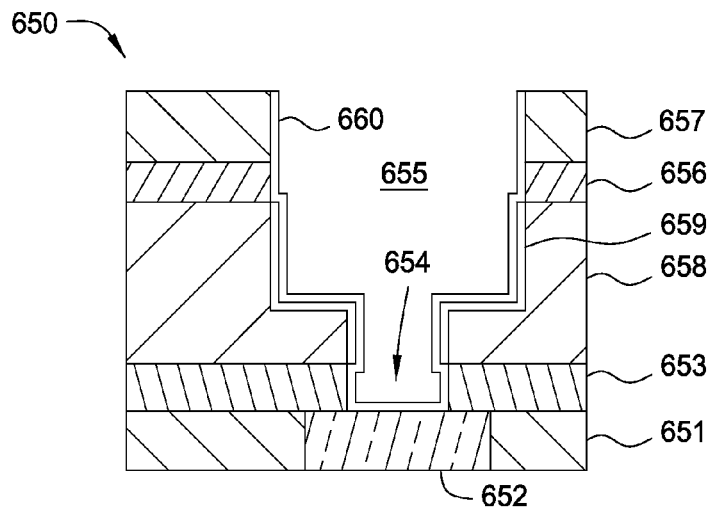
FIG. 6 is partial sectional view of a device formed using an embodiment of the invention.

FIG. 6 is partial sectional view of a device 650 formed using an embodiment of the invention. The device 650 includes a substrate 651, such as a silicon wafer, having an interconnect or metal layer 652, formed therein. In one example, the metal layer 652 may be formed from copper or another electrically conductive material. A dielectric barrier layer 653, such as a silicon nitride or a silicon carbonitride layer, is disposed on an upper surface of the substrate 651. The barrier layer 653 includes an opening 654 therein to expose a surface of the metal layer 652. A low k material 658, such as carbon-doped silicon oxide, is disposed on an upper surface of the barrier layer and includes a trench feature 655, such as a dual damascene structure, formed therein. In one example, the low k material may be a porous material having a dielectric constant of about 2.2-2.5, such as Black Diamond®, available from Applied Materials, Inc. of Santa Clara, Calif.

A first masking layer 656 and a second masking layer 657 are disposed above the low k material 658 to facilitate formation of the dual damascene structure. A carbon-doped silicon oxide film 659 is formed on the exposed surfaces (e.g., sidewalls) of the low k material 658 within the trench feature 655. The carbon-doped silicon oxide film 659 may be formed, for example, using the processes described with respect to FIG. 2. The processes of FIG. 2 may be performed cyclically to deposit a carbon-doped silicon oxide film of a desired thickness, such as about 10-20 angstroms. The carbon-doped silicon oxide film 659 may have a dielectric constant within a range of about 2.7 to about 3.9, such as about 2.7 to about 3.3.

The carbon-doped silicon oxide film 659 reduces or prevents diffusion or migration of metals or metal-containing precursors into the low k material 658, which would otherwise undesirably increase the k value of the low k material 658. In one example, to facilitate electrical connections within the device 650, the trench feature 655 may be filled with copper or another electrically conductive material (not shown). To prevent diffusion of copper into the low k material 658, prior devices included a PVD barrier layer on the surface of the low k material 658. However, as devices dimensions shrink, PVD barrier layers of desirable thicknesses (such as about 10-20 angstroms or less), cannot be formed while maintaining sufficient uniformity (and thus barrier properties).

As an alternative to PVD barrier layers, ALD barriers have been attempted. However, ALD precursors easily and quickly diffuse into the low k material 658, especially if the low k material 658 is porous, thereby increasing the k value of the low k material 658.

However, embodiments of the present invention facilitate formation of the carbon-doped silicon oxide film 659 via silylation. The carbon-doped silicon oxide film 659 does not suffer from deposition uniformity issues at relatively small thicknesses, such as about 10 angstroms, as do PVD-formed barrier layers. Additionally, formation of the carbon-doped silicon oxide film 659 does not increase the k value of the low k layer 658, as occurs when using ALD metal-containing precursors. In one example, an ALD barrier layer 660, such as a manganese-containing or tantalum-containing barrier layer, may be formed by ALD on the carbon-doped silicon oxide film 659, to reduce copper migration into the low k material 658. After formation of the of the ALD barrier layer 660, the masks 656, 657 may be removed from the device 650, and portions of the ALD barrier layer 660 in contact with the metal layer 652 may optionally be removed.

Additionally, it is to be noted that the formation of the carbon-doped silicon oxide layer 659 is selective to the low k material 658 (e.g., forms on the low k material 658 at a much greater rate than on metal layers such as copper, cobalt, ruthenium, or tungsten), and thus, the carbon-doped silicon oxide layer 659 does not undesirably form on the metal layer 652. In one example, the selectivity may be greater than about 10:1, such as about 10:1 to about 10,000:1. Formation of an oxide layer on the metal layer 652 would increase contact resistance between the metal layer 652 and a metal layer subsequently disposed thereon, thus negatively impacting device performance. In embodiments of the present invention, even if the surface of the metal layer 652 is partially oxidized during operations of the carbon-doped silicon oxide layer 659 formation, the oxidation is removed via exposure to plasma, for example, during operation 204 discussed with respect to FIG. 2, and thus, contact resistance is not increased. In one embodiment, it is contemplated that the carbon-doped silicon oxide layer 659 may form on the dielectric barrier layer 653, depending on the composition of the dielectric barrier layer 653 and the processing parameters selected for the formation of the carbon-doped silicon oxide layer 659.

FIG. 6 illustrates one embodiment; however, additional embodiments are also contemplated. In another embodiment, it is contemplated that the dual damascene structure may be a single damascene structure or trench.

Figure 7:
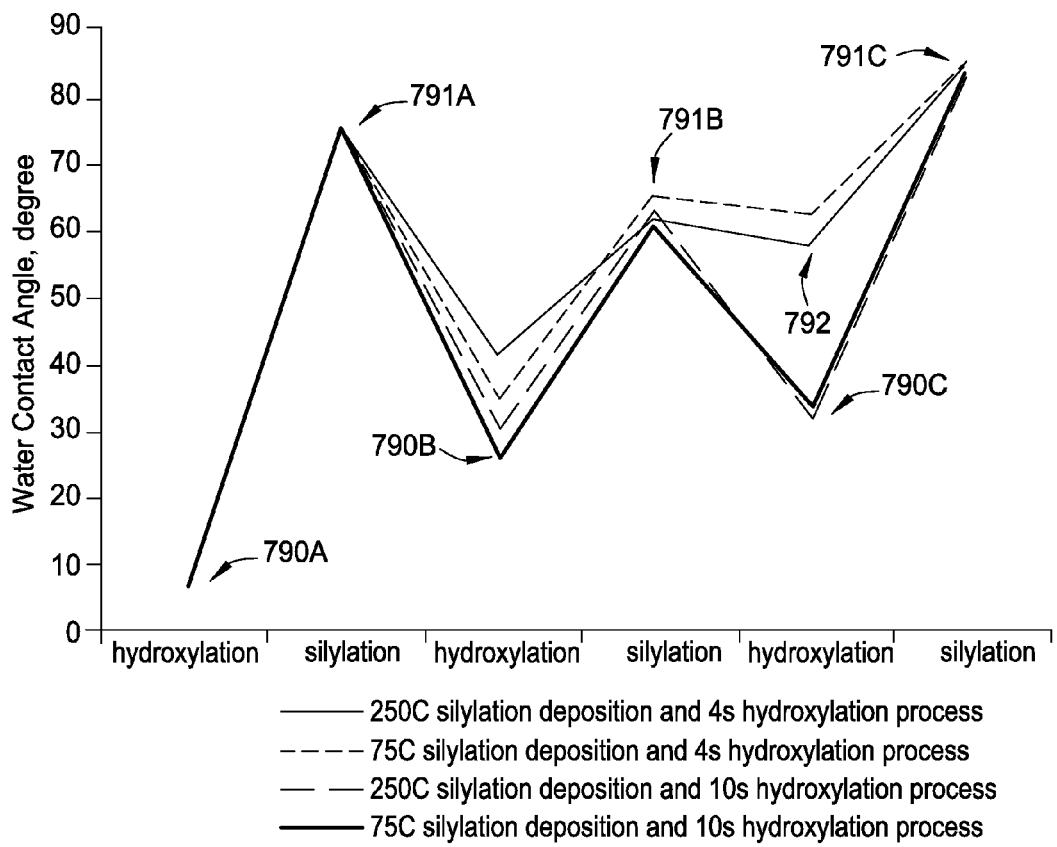
FIG. 7 is a graph illustrating water contact angle of a surface of a substrate during three cycles of hydroxylation/silylation according to one embodiment of the invention.

FIG. 7 is a graph illustrating water contact angle of a surface of a substrate during three cycles of hydroxylation/silylation according to one embodiment of the invention. The measurement of water contact angle provides evidence of reaction on the surface of the substrate. For example, SiOH materials, such as that illustrated in FIG. 3C, are hydrophilic, and have a relatively low water contact angle, such as at points 790 a,b,c. In contrast, silylated layers, such as that illustrated in FIG. 3D, are hydrophobic, and thus have relatively higher water contact angles, as illustrated at points 791 a,b,c.

Water contact angle measurements are performed for four different sets of operating conditions, having either a 75 degree Celsius or 250 degree Celsius silylation process, and a 4 second or 10 second hydroxylation process. A greater change in water contact angle between the points 790 a,b,c and 791 a,b,c indicates a more complete, and thus desirable, reaction. Referring to point 792, located between points 791b and 791c, the change in water contact angle is about 10 degrees or less, indicating relatively little formation of hydroxyl groups, consequently resulting in relatively little formation of carbon-doped silicon oxide film in that particular cycle.

Benefits of the invention generally include the reproducible deposition of carbon-doped silicon oxide films having relatively small thicknesses, such as less than about 100 angstroms or less than about 10 angstroms. The carbon-doped silicon oxide layers can be deposited via silylation by regenerating the surface of the substrate with a plasma and water treatment. Silylation allows for accurate layer-by-layer deposition, thus facilitating the formation of very thin layers having exact thicknesses.

While the foregoing is directed to embodiments of the present invention, other and further embodiments of the invention may be devised without departing from the basic scope thereof, and the scope thereof is determined by the claims that follow.

I claim:

1. A method of depositing a carbon-doped silicon oxide film, comprising:
   exposing a substrate to a first plasma treatment;
   exposing the substrate to a water-containing gas to form hydroxyl groups on a surface of the substrate;
   debonding water molecules from the surface of the substrate;
   performing silylation on the surface of the substrate; and
   regenerating the surface for additional silylation, the regeneration comprising:
      exposing the substrate to a second plasma treatment; and
      exposing the substrate to the water-containing gas to form hydroxyl groups on the surface of the substrate.

2. The method of claim 1, wherein the regenerating further comprises debonding water molecules from the surface of the substrate.

3. The method of claim 1, wherein exposing a substrate to a first plasma treatment includes exposing the substrate to a plasma formed from one or more of oxygen, ammonia, or carbon dioxide.

4. The method of claim 1, wherein the water-containing gas is formed using a water vapor generator.

5. The method of claim 1, wherein performing silylation on the surface of the substrate includes exposing the substrate to (dimethylamino)trimethylsilane.

6. The method of claim 1, wherein the carbon-doped silicon oxide film is deposited on a low-k material.

7. The method of claim 6, wherein the carbon-doped silicon oxide film functions a barrier layer.

8. The method of claim 7, wherein the carbon-doped silicon oxide layer is formed to a thickness of about 10 angstroms to about 20 angstroms.

9. The method of claim 1, wherein the performing silylation on the surface of the substrate and the regenerating the surface for additional silylation is performed cyclically for about 10 cycles to about 100 cycles.

10. The method of claim 1, wherein performing silylation on the surface of the substrate includes exposing the substrate to bis(dimethylamino)dimethylsilane.

11. A method of forming a device on a substrate, comprising:
   depositing a carbon-doped silicon oxide layer on a low k material, the carbon doped silicon oxide layer is deposited by cyclically performing the operations of:
      (a) exposing the substrate to a plasma treatment;
      (b) exposing the substrate to the water-containing gas to form hydroxyl groups; and
      (c) performing a silylation reaction with the hydroxyl groups.

12. The method of claim 11, wherein the device includes an exposed copper layer, and the formation of the carbon doped silicon oxide layer forms on the low k material at a greater rate than on the exposed copper layer.

13. The method of claim 12, further comprising subsequently forming a barrier layer on the carbon-doped silicon oxide layer, the barrier formed by atomic layer deposition or physical layer deposition, wherein the barrier layer is a tantalum-containing or manganese-containing layer.

14. The method of claim 11, wherein the plasma treatment includes exposing the substrate to a plasma formed from ammonia, the performing a silylation reaction with the hydroxyl groups includes exposing the substrate to (dimethylamino)trimethylsilane or bis(dimethylamino)dimethylsilane, the water-containing gas is formed using a water vapor generator, the low k material is a porous low k material.

15. The method of claim 11, wherein the carbon-doped silicon oxide layer is formed to a thickness of about 10 angstroms to about 20 angstroms, and performing silylation on the surface of the substrate includes exposing the substrate to (dimethylamino)trimethylsilane.

* * * * *